(12) United States Patent
Tsai et al.

(10) Patent No.: US 9,570,497 B2
(45) Date of Patent: Feb. 14, 2017

(54) BACK SIDE ILLUMINATED IMAGE SENSOR HAVING ISOLATED BONDING PADS

(71) Applicant: TAIWAN SEMICONDUCTOR MANUFACTURING COMPANY, LTD., Hsin-Chu (TW)

(72) Inventors: Shuang-Ji Tsai, Guiren Township, Tainan County (TW); Dun-Nian Yaung, Taipei (TW); Jen-Cheng Liu, Hsin-Chu (TW); Wen-De Wang, Minsyong Township, Chiayi County (TW); Hsiao-Hui Tseng, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/875,002

(22) Filed: Oct. 5, 2015

(65) Prior Publication Data

US 2016/0027836 A1    Jan. 28, 2016

Related U.S. Application Data

(62) Division of application No. 13/028,471, filed on Feb. 16, 2011, now Pat. No. 9,165,970.

(51) Int. Cl.
| | |
|---|---|
| *H01L 23/00* | (2006.01) |
| *H01L 27/146* | (2006.01) |
| *H01L 23/48* | (2006.01) |
| *H01L 23/525* | (2006.01) |

(52) U.S. Cl.
CPC ..... *H01L 27/14638* (2013.01); *H01L 27/1464* (2013.01); *H01L 27/14636* (2013.01); *H01L 27/14683* (2013.01); *H01L 27/14687* (2013.01); *H01L 27/14689* (2013.01); *H01L 23/481* (2013.01); *H01L 23/525* (2013.01); *H01L 24/83* (2013.01); *H01L 27/14623* (2013.01)

(58) Field of Classification Search
CPC .......... H01L 27/1464; H01L 27/14636; H01L 27/14623; H01L 23/481; H01L 23/525; H01L 24/83
See application file for complete search history.

(56) References Cited

U.S. PATENT DOCUMENTS

| | | | |
|---|---|---|---|
| 6,169,319 B1 * | 1/2001 | Malinovich | H01L 27/14609 257/228 |
| 2008/0135967 A1 | 6/2008 | Kitagawa et al. | |
| 2008/0246152 A1 * | 10/2008 | Liu | H01L 24/05 257/758 |

(Continued)

*Primary Examiner* — Kimberly Rizkallah
*Assistant Examiner* — Alexander Belousov
(74) *Attorney, Agent, or Firm* — Haynes and Boone, LLP

(57) ABSTRACT

Provided is a method of fabricating an image sensor device. An exemplary includes forming a plurality of radiation-sensing regions in a substrate. The substrate has a front surface, a back surface, and a sidewall that extends from the front surface to the back surface. The exemplary method further includes forming an interconnect structure over the front surface of the substrate, removing a portion of the substrate to expose a metal interconnect layer of the interconnect structure, and forming a bonding pad on the interconnect structure in a manner so that the bonding pad is electrically coupled to the exposed metal interconnect layer and separated from the sidewall of the substrate.

19 Claims, 8 Drawing Sheets

(56) References Cited

U.S. PATENT DOCUMENTS

2009/0146148 A1    6/2009  Pyo
2009/0185060 A1    7/2009  Akiyama
2009/0280596 A1*  11/2009  Akiyama .......... H01L 21/76898
                                                438/70
2012/0205769 A1    8/2012  Tsai et al.

\* cited by examiner

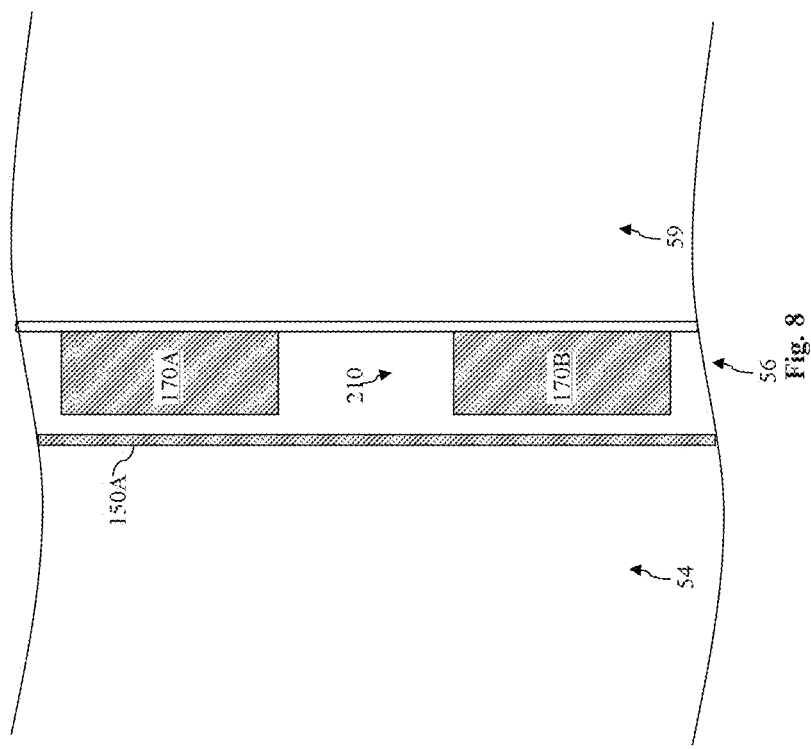

BACK SIDE ILLUMINATED IMAGE SENSOR HAVING ISOLATED BONDING PADS

PRIORITY DATA

The present application is a divisional application of U.S. patent application Ser. No. 13/028,471, filed Feb. 16, 2011 and entitled "BACK SIDE ILLUMINATED IMAGE SENSOR HAVING ISOLATED BONDING PADS," which is hereby incorporated by reference in its entirety.

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, that can absorb radiation projected toward the substrate and convert the sensed radiation into electrical signals.

A back side illuminated (BSI) image sensor device is one type of image sensor device. These BSI image sensor devices are operable to detect light from its back side. A BSI image sensor device has a relatively large step-height between a device region of a wafer and a bond pad region. This step height may lead to etching difficulties when bond pads are formed, which may induce leakage between adjacent bond pads through a sidewall of the wafer. Such leakage degrades BSI image sensor device performance and is therefore undesirable.

Hence, while existing methods of fabricating BSI image sensor devices have been generally adequate for their intended purposes, they have not been entirely satisfactory in every aspect.

BRIEF DESCRIPTION OF THE DRAWINGS

Aspects of the present disclosure are understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 8 is a diagrammatic top level view of an image sensor device at a stage of fabrication in accordance with various aspects of the present disclosure.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
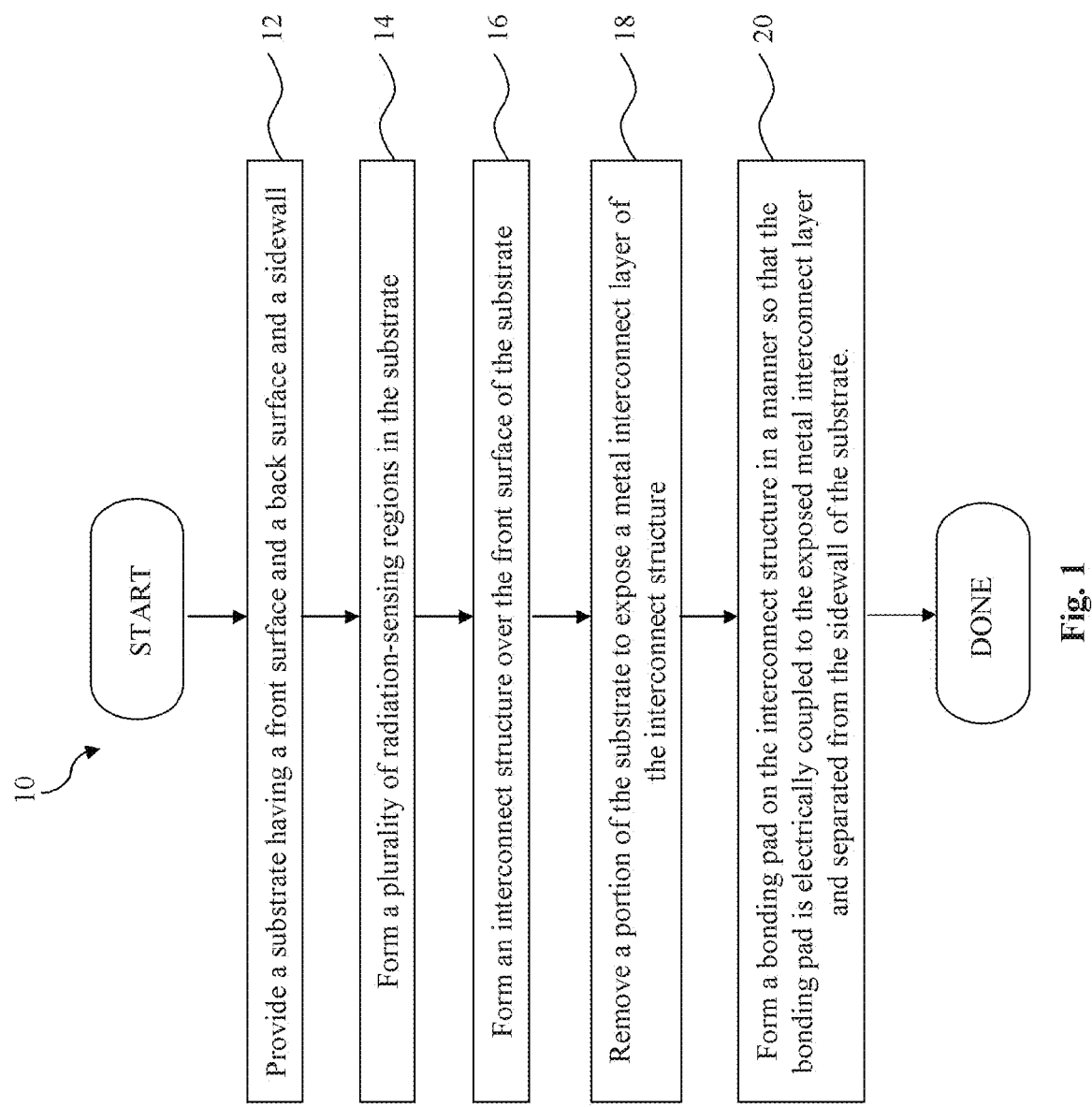
FIG. 1 is a flowchart illustrating a method for fabricating an image sensor device according to various aspects of the present disclosure.

Illustrated in FIG. 1 is a flowchart of a method 10 for fabricating a back-side illuminated (BSI) image sensor device according to various aspects of the present disclosure. Referring to FIG. 1, the method 10 begins with block 12 in which a substrate having a front surface and a back surface and a sidewall is provided. The sidewall is perpendicular to the front surface and the back surface. The method 10 continues with block 14 in which a plurality of radiation-sensing regions are formed in the substrate. Each of the radiation-sensing regions is operable to sense radiation projected toward the radiation-sensing region through the back surface. The method 10 continues with block 16 in which an interconnect structure is formed over the front surface of the substrate. The method 10 continues with block 18 in which a portion of the substrate is removed to expose a metal interconnect layer of the interconnect structure. The method 10 continues with block 20 in which a bonding pad is formed on the interconnect structure in a manner so that the bonding pad is electrically coupled to the exposed metal interconnect layer and separated from the sidewall of the substrate.

FIGS. 2 to 7 are diagrammatic fragmentary sectional side views of various embodiments of an apparatus that is a BSI image sensor device 30 at various stages of fabrication according to aspects of the method 10 of FIG. 1. The image sensor device 30 includes an array or grid of pixels for sensing and recording an intensity of radiation (such as light) directed toward a back-side of the image sensor device 30. The image sensor device 30 may include a charge-coupled device (CCD), complimentary metal oxide semiconductor (CMOS) image sensor (CIS), an active-pixel sensor (APS), or a passive-pixel sensor. The image sensor device 30 further includes additional circuitry and input/outputs that are provided adjacent to the grid of pixels for providing an operation environment for the pixels and for supporting external communication with the pixels. It is understood that FIGS. 2 to 8 have been simplified for a better understanding of the inventive concepts of the present disclosure and may not be drawn to scale.

Figure 2:
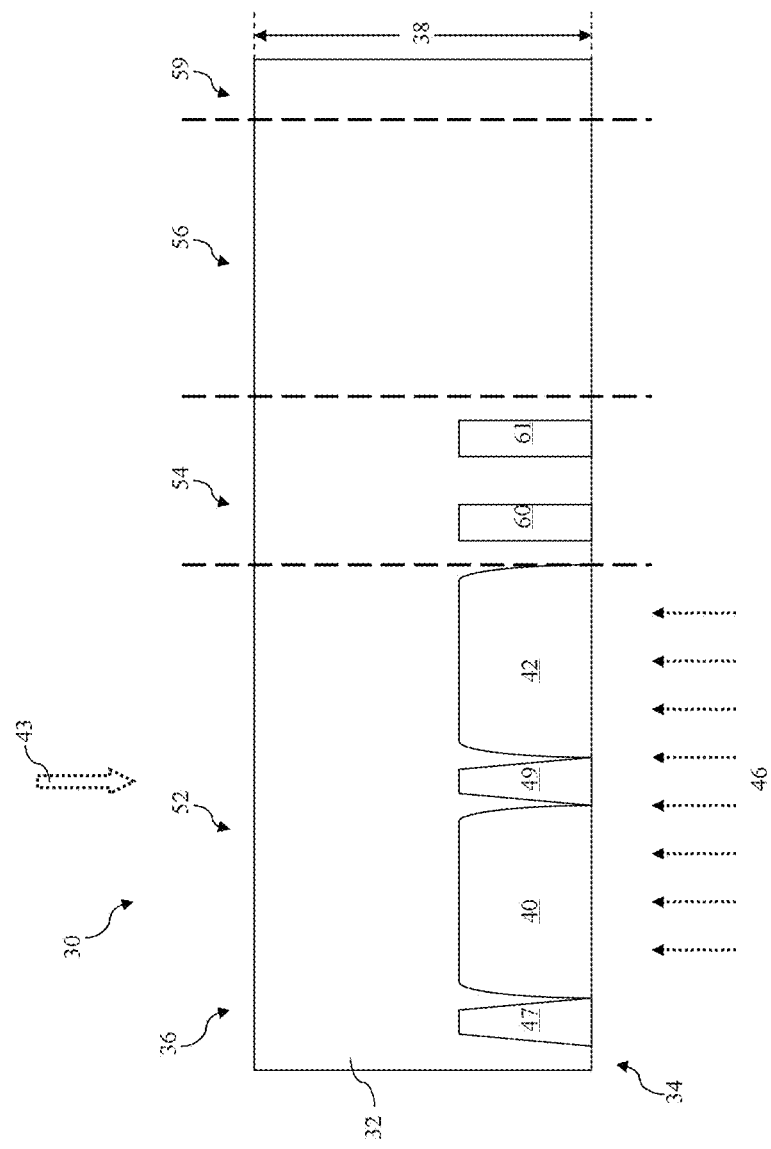
FIGS. 2, 3, 4, 5, 6, and 7 are diagrammatic fragmentary cross-sectional side views of an image sensor device at various stages of fabrication in accordance with various aspects of the present disclosure.

With reference to FIG. 2, the image sensor device 30 includes a device substrate 32. The device substrate 32 is a silicon substrate doped with a p-type dopant such as boron (for example a p-type substrate). Alternatively, the device substrate 32 could be another suitable semiconductor material. For example, the device substrate 32 may be a silicon substrate that is doped with an n-type dopant such as phosphorous or arsenic (an n-type substrate). The device substrate 32 could include other elementary semiconductors such as germanium and diamond. The device substrate 32 could optionally include a compound semiconductor and/or an alloy semiconductor. Further, the device substrate 32 could include an epitaxial layer (epi layer), may be strained for performance enhancement, and may include a silicon-on-insulator (SOI) structure. Referring back to FIG. 2, the device substrate 32 has a front side (also referred to as a front surface) 34 and a back side (also referred to as a back surface) 36. The device substrate 32 also has an initial thickness 38 that is in a range from about 100 microns (um) to about 3000 um. In the present embodiment, the initial thickness 38 is about 750 um.

Radiation-sensing regions—for example, pixels 40 and 42—are formed in the device substrate 32. The pixels 40 and 42 are operable to sense radiation, such as an incident light 43, that is projected toward the back side 36 of the device substrate 32. The pixels 40 and 42 each include a photodiode in the present embodiment. In other embodiments, the pixels 40 and 42 may include pinned layer photodiodes, photogates, reset transistors, source follower transistors, and transfer transistors. The pixels 40 and 42 may also be referred to as radiation-detection devices.

The pixels 40 and 42 may be varied from one another to have different junction depths, thicknesses, widths, and so forth. For the sake of simplicity, only two pixels 40 and 42 are illustrated in FIG. 2, but it is understood that any number of radiation-sensing regions may be implemented in the device substrate 32. In the embodiment shown, the pixels 40 and 42 are formed by performing an implantation process 46 on the device substrate 32 from the front side 34. The implantation process 46 includes doping the device substrate 32 with a p-type dopant such as boron. In an alternative embodiment, the implantation process 46 may include doping the device substrate 32 with an n-type dopant such as phosphorous or arsenic. In other embodiments, the pixels 40 and 42 may also be formed by a diffusion process.

Referring back to FIG. 2, the device substrate 32 includes isolation structures—for example, isolation structures 47 and 49—that provide electrical and optical isolation between the pixels 40 and 42. The isolation structures 47 and 49 include shallow trench isolation (STI) structures that are formed of a dielectric material such as silicon oxide or silicon nitride. The STI structures are formed by etching openings into the substrate 32 from the front side 34 and thereafter filling the openings with the dielectric material. In other embodiments, the isolation structures 47 and 49 may include doped isolation features, such as heavily doped n-type or p-type regions. It is understood that the isolation structures 47 and 49 are formed before the pixels 40 and 42. Also, for the sake of simplicity, only two isolation structures 47 and 49 are illustrated in FIG. 2, but it is understood that any number of isolation structures may be implemented in the device substrate 32 so that the radiation-sensing regions such as pixels 40 and 42 may be properly isolated.

Still referring to FIG. 2, the pixels 40 and 42 and isolation structures 47 and 49 are formed in a region of the image sensor device 30 referred to as a pixel region 52. The image sensor 30 also includes a periphery region 54, a bonding pad region 56 (also referred to as a bond pad region), and a scribe line region 59. The dashed lines in FIG. 2 designate the approximate boundaries between the regions 52, 54, 56, and 59. The periphery region 54 includes devices 60 and 61 that need to be kept optically dark. For example, the device 60 in the present embodiment may be a digital device, such as an application-specific integrated circuit (ASIC) device or a system-on-chip (SOC) device. The device 61 may be a reference pixel that is used to establish a baseline of an intensity of light for the image sensor device 30.

Referring back to FIG. 2, the bonding pad region 56 includes a region where one or more bonding pads (not illustrated) of image sensor device 30 will be formed in a later processing stage, so that electrical connections between the image sensor device 30 and outside devices may be established. The scribe line region 59 includes a region that separates one semiconductor die (for example, a semiconductor die that includes the bonding pad region 56, periphery region 54, and the pixel region 52) from an adjacent semiconductor die (not illustrated). The scribe line region 59 is cut therethrough in a later fabrication process to separate adjacent dies before the dies are packaged and sold as integrated circuit chips. The scribe line region 59 is cut in such a way that the semiconductor devices in each die are not damaged. It is also understood that these regions 52-59 extend vertically above and below the device substrate 32.

Figure 3:
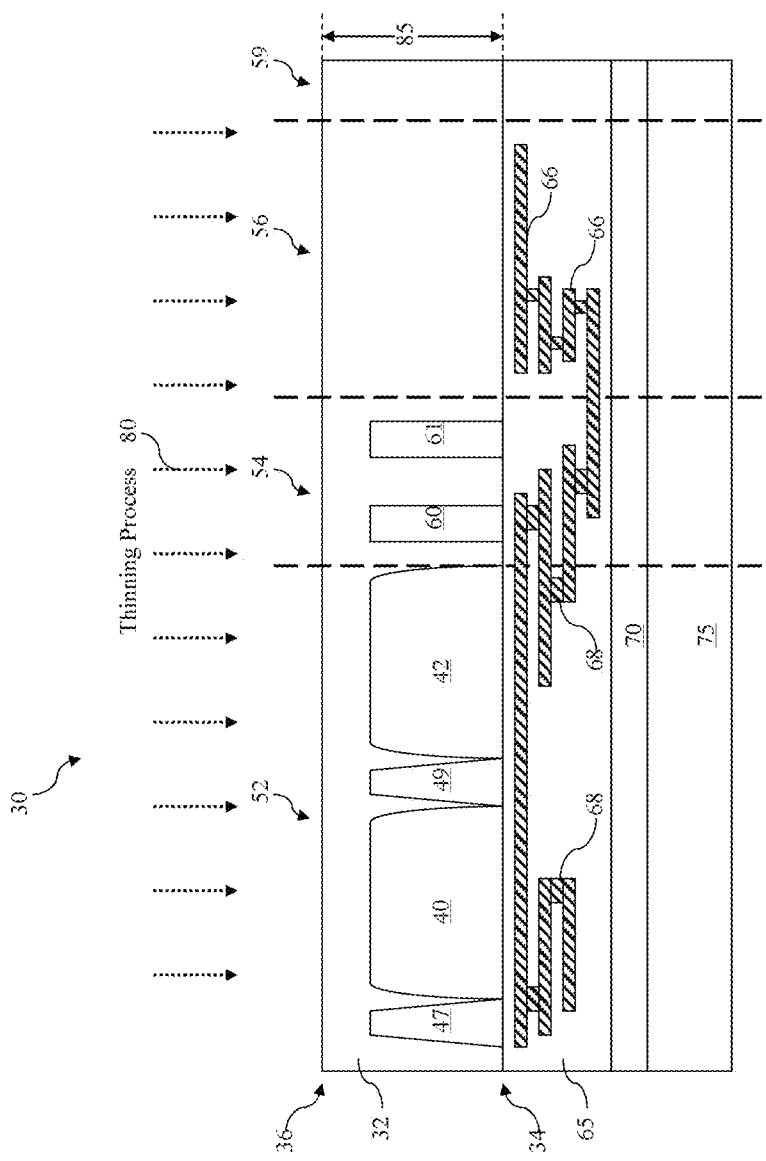

Referring now to FIG. 3, an interconnect structure 65 is formed over the front side 34 of the device substrate 32. The interconnect structure 65 includes a plurality of patterned dielectric layers and conductive layers that provide interconnections (e.g., wiring) between the various doped features, circuitry, and input/output of the image sensor device 30. The interconnect structure 65 includes an interlayer dielectric (ILD) and a multilayer interconnect (MLI) structure. The MLI structure includes contacts, vias and metal lines. For the purposes of illustration, a plurality of conductive lines 66 and vias/contacts 68 are shown in FIG. 3, it being understood that the conductive lines 66 and vias/contacts 68 illustrated are merely exemplary, and the actual positioning and configuration of the conductive lines 66 and vias/contacts 68 may vary depending on design needs.

The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts 68) and horizontal connection (for example, conductive lines 66). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Still referring to FIG. 3, a buffer layer 70 is formed on the interconnect structure 65. In the present embodiment, the buffer layer 70 includes a dielectric material such as silicon oxide. Alternatively, the buffer layer 70 may optionally include silicon nitride. The buffer layer 70 is formed by CVD, PVD, or other suitable techniques. The buffer layer 70 is planarized to form a smooth surface by a chemical mechanical polishing (CMP) process.

Thereafter, a carrier substrate 75 is bonded with the device substrate 32 through the buffer layer 70, so that processing the back side 36 of the device substrate 32 can be performed. The carrier substrate 75 in the present embodiment is similar to the substrate 32 and includes a silicon material. Alternatively, the carrier substrate 75 may include a glass substrate or another suitable material. The carrier substrate 75 may be bonded to the device substrate 32 by molecular forces—a technique known as direct bonding or optical fusion bonding—or by other bonding techniques known in the art, such as metal diffusion or anodic bonding.

Referring back to FIG. 3, the buffer layer 70 provides electrical isolation between the device substrate 32 and the carrier substrate 75. The carrier substrate 75 provides protection for the various features formed on the front side 34 of the device substrate 32, such as the pixels 40 and 42. The carrier substrate 75 also provides mechanical strength and support for processing the back side 36 of the device substrate 32 as discussed below. After bonding, the device substrate 32 and the carrier substrate 75 may optionally be annealed to enhance bonding strength.

Referring back to FIG. 3, a thinning process 80 is then performed to thin the device substrate 32 from the back side 36. The thinning process 80 may include a mechanical grinding process and a chemical thinning process. A substantial amount of substrate material may be first removed from the device substrate 32 during the mechanical grinding process. Afterwards, the chemical thinning process may apply an etching chemical to the back side 36 of the device substrate 32 to further thin the device substrate 32 to a thickness 85. In the present embodiment, the thickness 85 is less than about 5 um, for example about 2-3 um. In an embodiment, the thickness 85 is greater than at least about 1 um. It is also understood that the particular thicknesses disclosed in the present disclosure are mere examples and that other thicknesses may be implemented depending on the type of application and design requirements of the image sensor device 30.

Figure 4:
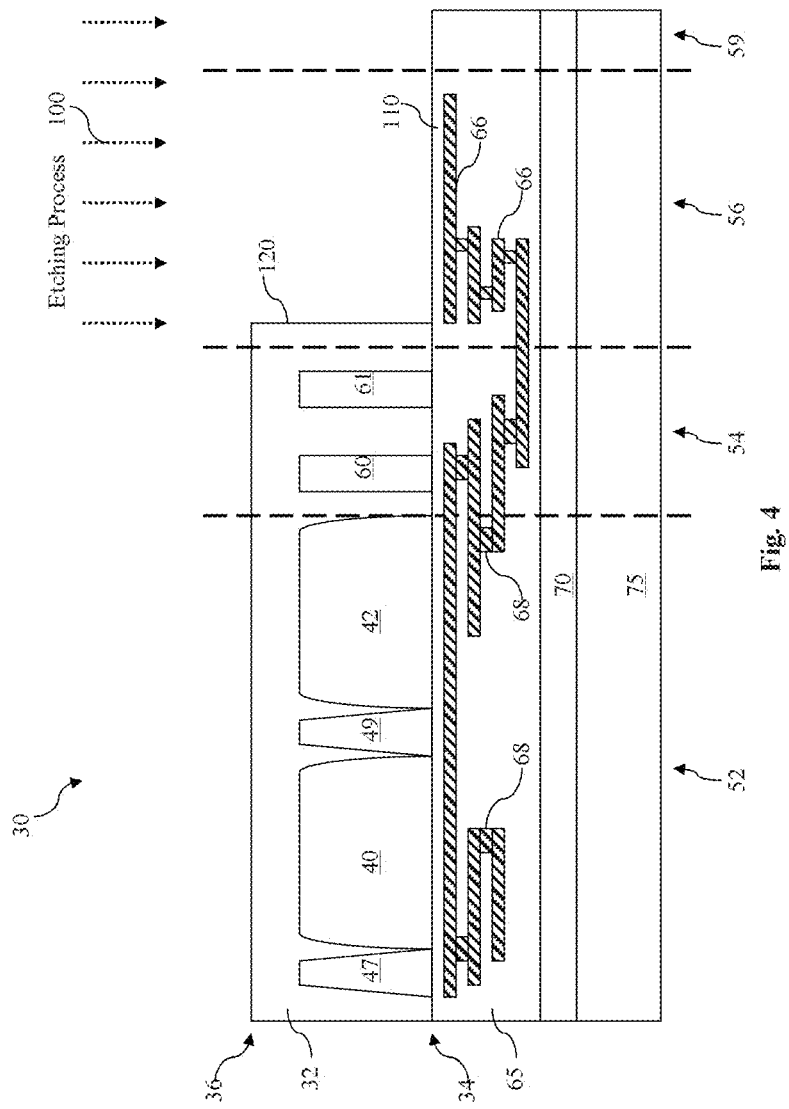

Referring now to FIG. 4, a portion of the device substrate 32 in the bonding pad region 56 and the scribe line region 59 is removed by an etching process 100. Thus, an ILD layer 110 of the interconnect structure 65 within the bonding pad region 56 is exposed. The etching process 100 also results in a sidewall 120 of the device substrate 32. The sidewall 120 extends in a direction that is perpendicular to the direction in which the front side 34 or the back side 36 extends. In the embodiment shown, the sidewall 120 extends in a vertical direction, whereas the front side 34 and the back side 36 each extend in a horizontal (or lateral) direction. The sidewall 120 also is approximately aligned with an internal seal ring that is formed later.

Figure 5:
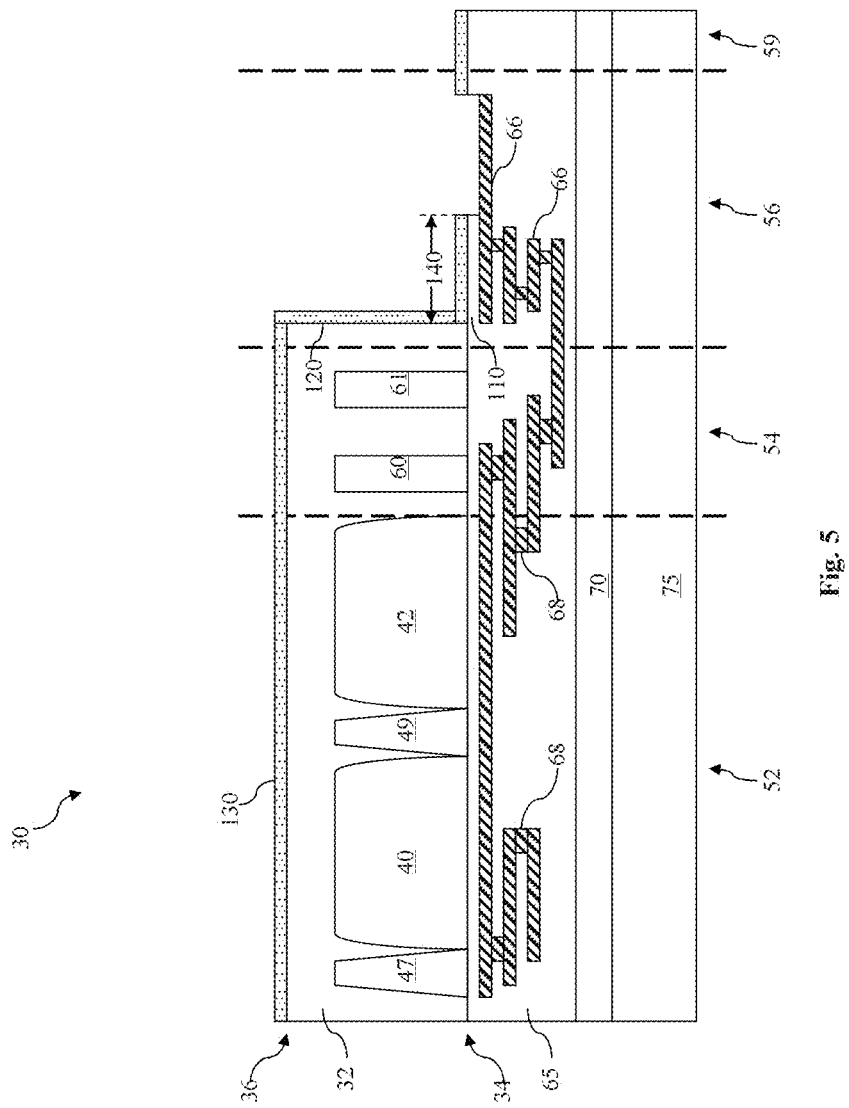

Referring now to FIG. 5, an oxide layer 130 is formed over the back side 36 of the device substrate 32 and over the exposed surface of the ILD layer 110 in the bonding pad region 56. Thereafter, a portion of the bonding pad region is etched to expose a portion of the top-most conductive line 66 in a Metal-1 layer. A bonding pad will be formed on the exposed conductive line 66 in the Metal-1 layer. At this stage of fabrication, the portion of the ILD layer 110 that extends beyond the sidewall 120 has a lateral dimension 140. In other words, the portion of the ILD layer 110 protrudes horizontally beyond the sidewall 120 by the distance of dimension 140. In an embodiment, the lateral dimension/distance is in a range from about 3 um to about 4 um. It is also understood that a bottom anti-reflective coating (BARC) layer may be formed over the oxide layer 130, and an additional oxide layer may be formed over the BARC layer. However, for reasons of simplicity, the BARC layer and the additional oxide layer are not illustrated herein.

Figure 6:
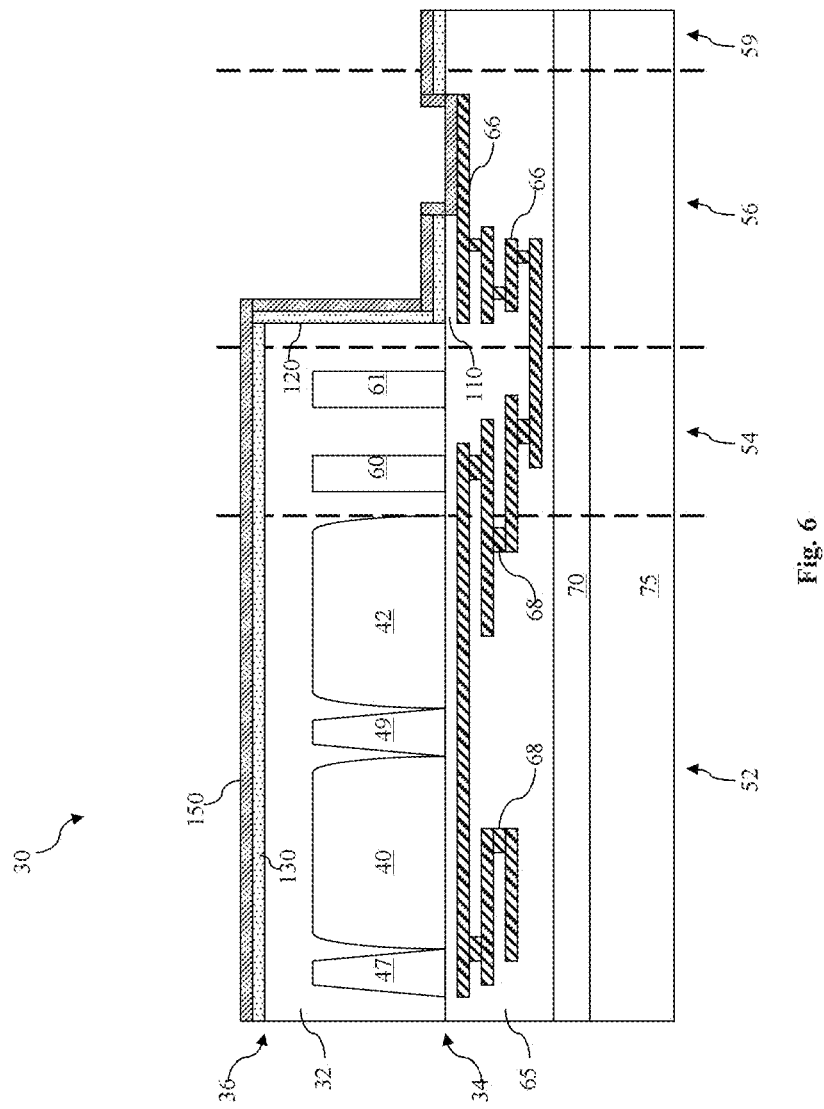

Referring now to FIG. 6, a conductive layer 150 is formed over the oxide layer 130 from the back side 36 and over the conductive line 66 in the bonding pad region 56. In an embodiment, the conductive layer 150 includes a metal or a metal alloy material, for example aluminum (Al) or an aluminum copper alloy (AlCu). A portion of the conductive layer 150 comes into physical contact with the top-most conductive line 66 in the Metal-1 layer in the interconnect structure 65. This portion of the conductive layer 150 will be patterned into a bonding pad later.

Figure 7:
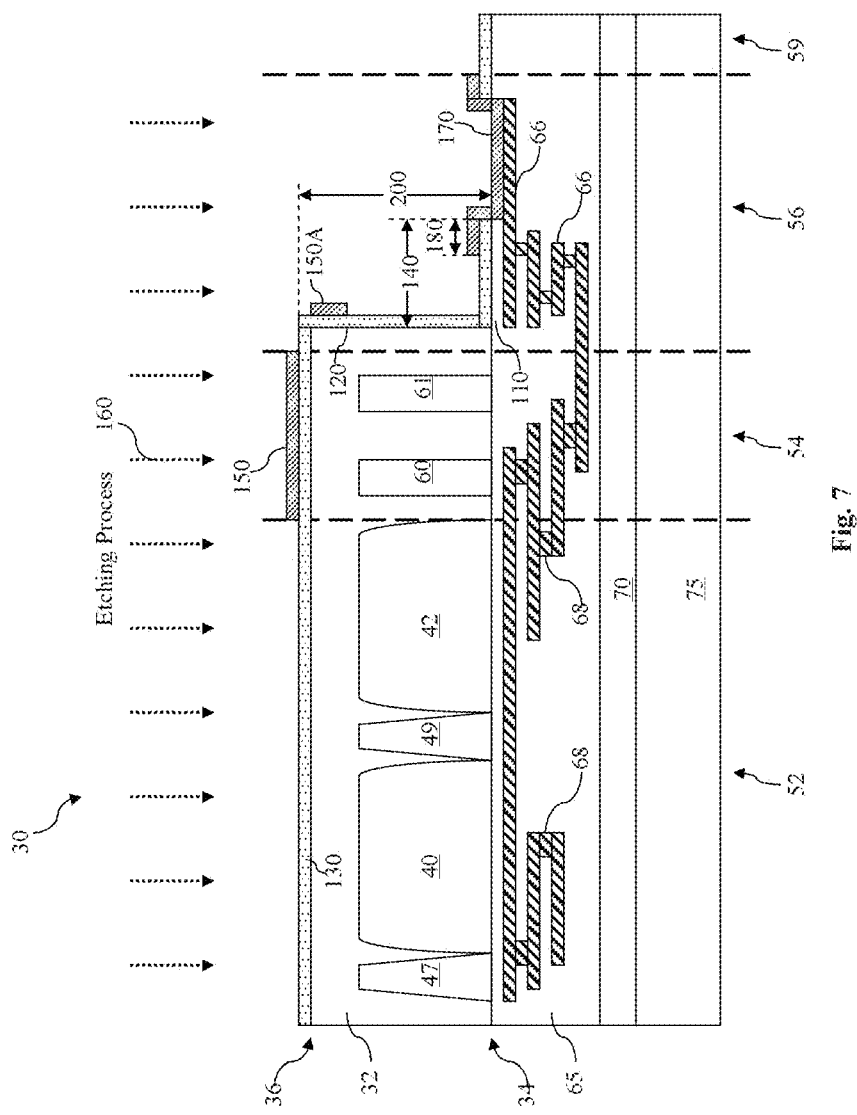

Referring now to FIG. 7, an etching process 160 is performed to remove the portion of the conductive layer 150 covering the pixel region 52, so that radiation that is supposed to be detected by the pixels 40 and 42 will not be obstructed by the conductive layer 150 (likely opaque). The etching process 160 also removes a portion of the conductive layer 150 in the bonding pad region 56 in a manner such that the remaining portion of the conductive layer 150 in the bonding pad region 56 forms a conductive bonding pad 170. The bonding pad 170 is physically separated from the sidewall 120 of the device substrate 32. The bonding pad 170 comes into contact with (and is therefore electrically coupled to) the conductive line 66 of the Metal-1 layer. Therefore, through the bonding pad 170, electrical connections can be established between the image sensor device 30 and external devices. The bonding pad 170 may have a lateral dimension or a width in a range from about 50 um to about 200 um, for example about 80 um. In other words, the lateral dimension of the bonding pad 170 is substantially greater than the dimension 140 shown in FIG. 7. Therefore, it is emphasized again that the various features and components of FIG. 7 are not drawn in scale.

A portion of the bonding pad 170 (which can be viewed as an extension of the bonding pad 170) overlies the portion of the ILD layer 110. This portion of the bonding pad 170 has a lateral dimension 180 that is smaller than the lateral dimension 140. In other words, this configuration (having the dimension 140 be greater than the dimension 180) ensures that the bonding pad 170 is physically separated from the sidewall 120 and any residue 150A of the conductive layer 150 left on the sidewall 120 due to the limitations of the etching process 160. The residue 150A potentially exists because of a relatively large step height 200 between the back side 36 of the device substrate 32 and the bonding pad 170. The step height 200 is roughly equal to the reduced thickness 85 of the device substrate 32, which is about 2-3 um in an embodiment. As a result of the large step height 200, it is difficult for the etching process 160 to completely get rid of the entire portion of the conductive layer 150 on the sidewall 120. As a result, the residue 150A is likely to exist on a portion of the sidewall 120. If this residue 150A is not completely de-coupled from the bonding pad 170, then the bonding pad 170 will short circuit with an adjacent bonding pad. This shorting is illustrated more clearly from a top view perspective, as discussed below.

Referring to FIG. 8, a simplified top-level view of a portion of the image sensor device 30 is illustrated. Two adjacent bonding pads 170A and 170B are shown in a vertically-aligned manner in the bonding pad region 56. The bonding pads 170A are vertically separated, and a dummy pattern 210 may exist between these adjacent bonding pads 170A and 170B. The residue 150A vertically spans through the sidewall of the device substrate 32. It can be seen now that had the bonding pads 170A and 170B not been physically separated from the sidewall of the device substrate 32, then the residue 150A may in effect form a conductive path between the bonding pads 170A and 170B, thereby shorting these two bonding pads together. This shorting of the bonding pads 170A-170B is undesirable, as it causes pad-to-pad leakage. The relatively big step-height 200 (shown in FIG. 7) exacerbates the shorting problem, because as the step-height increases, it is increasingly more difficult for the sidewall of the device substrate 32 to be free of residue of the conductive layer 150. This means that as the step-height becomes taller, shorting between adjacent bonding pads is more likely for existing devices.

Here, the potential shorting problem is prevented by making sure that the bonding pads 170A-170B are severed from the sidewall (and any potential residue 150A formed on the sidewall) by the etching process 160. Thus, any residue 150A formed on the sidewall will not become a problem, and the bonding pads 170A and 170B are still electrically isolated from one another. This is one of the advantages offered by the embodiments disclosed herein, though it is understood that other embodiments may offer different advantages, and that no particular advantage is required for all embodiments. Another advantage is that the methods and structure disclosed herein are easy to implement and requires no extra processes. Further, since conductive residue left on the sidewall is no longer an issue, the load of the etching process used to define the bonding pads is lessened. In other words, such etching process need not remove all the conductive material on the sidewall anymore.

Referring back to FIG. 7, though not illustrated, additional processing is performed to complete the fabrication of the image sensor device 30. For example, a passivation layer may be formed around the image sensor device 30 for protection (for example against dust or humidity). Color filters may be formed within the pixel region 52. The color filters may be positioned such that the incoming light is directed thereon and therethrough. The color filters may include a dye-based (or pigment based) polymer or resin for filtering a specific wavelength band of the incoming light, which corresponds to a color spectrum (e.g., red, green, and blue). Thereafter, micro-lenses are formed over the color filters for directing and focusing the incoming light toward specific radiation-sensing regions in the device substrate 32, such as pixels 40 and 42. The micro-lenses may be positioned in various arrangements and have various shapes depending on a refractive index of material used for the micro-lens and distance from a sensor surface. It is also understood that the device substrate 32 may also undergo an optional laser annealing process before the forming of the color filters or the micro-lenses.

One of the broader forms of the present disclosure involves an image sensor device that includes: a substrate having a front surface, a back surface, and a sidewall that is perpendicular to the front and back surfaces; a radiation-detection device formed in the substrate, the radiation-detection device being operable to detect radiation waves that enter the substrate through the back surface; an interconnect structure formed on the front surface of the substrate, the interconnect structure extending beyond the sidewall of the substrate; and a conductive pad formed on the interconnect structure, the conductive pad being adjacent to, but separated from, the sidewall.

Another of the broader forms of the present disclosure involves an image sensor device that includes: a substrate having a front side, a back side, and a sidewall connecting the front and back sides; a plurality of radiation-sensing regions disposed in the substrate, each of the radiation-sensing regions being operable to sense radiation projected toward the radiation-sensing region through the back side; an interconnect structure that is coupled to the front side of the substrate, the interconnect structure including a plurality of interconnect layers and extending beyond the sidewall of the substrate; and a bonding pad that is spaced apart from the sidewall of the substrate, the bonding pad being electrically coupled to one of the interconnect layers of the interconnect structure.

Still another of the broader forms of the present disclosure involves a method of fabricating an image sensor device, the method includes: providing a substrate having a front surface and a back surface and a sidewall that is perpendicular to the front surface and the back surface; forming a plurality of radiation-sensing regions in the substrate, each of the radiation-sensing regions being operable to sense radiation projected toward the radiation-sensing region through the back surface; forming an interconnect structure over the front surface of the substrate; removing a portion of the substrate to expose a metal interconnect layer of the interconnect structure; and forming a bonding pad on the interconnect structure in a manner so that the bonding pad is electrically coupled to the exposed metal interconnect layer and separated from the sidewall of the substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   forming a plurality of radiation-sensing regions in a substrate, the substrate having a front surface, a back surface, and a sidewall extending from the front surface to the back surface;
   forming an interconnect structure over the front surface of the substrate;
   removing a portion of the substrate to expose a conductive interconnect line of the interconnect structure;
   forming an oxide layer over the back surface of the substrate and over the exposed conductive interconnect line;
   removing a portion of the oxide layer that is over the exposed conductive interconnect line; and
   forming a bonding pad on the interconnect structure, wherein the bonding pad is electrically coupled to the exposed conductive interconnect line and separated from the sidewall of the substrate.

2. The method of claim 1, wherein forming the bonding pad comprises:
   forming a conductive material layer over the substrate and over the exposed conductive interconnect line of the interconnect structure; and
   etching the conductive material layer to remove a portion of the conductive material layer adjacent to the sidewall, thereby forming the bonding pad with a remaining portion of the conductive material layer that is in contact with the conductive interconnect line.

3. The method of claim 2, wherein etching the conductive material layer is carried out in a manner so that a residue of the conductive material layer remains on the sidewall after the etching, wherein the residue is physically separated from the bonding pad.

4. The method of claim 1, wherein forming the bonding pad is carried out in a manner so that a step-height of greater than about 1 μm exists between back side of the substrate and the bonding pad.

5. The method of claim 1, wherein the exposed conductive interconnect line is a top-most conductive interconnect line of a plurality of conductive interconnect lines, such that the exposed conductive interconnect line is located closest to the substrate.

6. The method of claim 1, further comprising, before removing the portion of the substrate:
   bonding the substrate to a carrier substrate; and
   thinning the substrate from the back surface.

7. The method of claim 1, further comprising providing the substrate having the front surface, the back surface, and the sidewall.

8. The method of claim 1, wherein the radiation-sensing regions are operable to sense radiation projected toward the radiation-sensing regions through the back surface of the substrate.

9. The method of claim 1, wherein removing the portion of the substrate to expose the conductive interconnect line of the interconnect structure comprises:
performing a first etching process to remove a first portion of the substrate overlying the conductive interconnect line and to remove a second portion of the substrate that defines a scribe line region; and
performing a second etch process to etch through an exposed portion of an interlayer dielectric layer to expose a portion of the conductive interconnect line.

10. The method of claim 1, wherein forming a bonding pad on the interconnect structure comprises:
depositing a conductive layer over the exposed conductive interconnect line; and
etching the conductive layer to define a conductive bonding pad and to separate the conductive bonding pad from the sidewall by a first distance.

11. A method comprising:
positioning a semiconductor substrate in an etch chamber, the semiconductor substrate including a plurality of image sensor devices, each image sensor device having:
a pixel region with a plurality of radiation-sensing regions,
a bonding pad region, and
a scribe line region, and wherein the semiconductor substrate includes an interconnect structure, a first portion of the interconnect structure formed within the pixel region and a second portion of the interconnect structure extending into the bonding pad region;
performing a first etching process to expose an interlayer dielectric (ILD) layer of the interconnect structure in the bonding pad region;
performing a second etching process to remove a portion of the ILD layer that overlays a conductive interconnect layer of the interconnect structure in the bonding pad region, thereby exposing a portion of conductive interconnect layer;
forming an oxide layer over a back side of the semiconductor substrate and over the exposed portion of the conductive interconnect layer in the bonding pad region;
removing the portion of the oxide layer that is over the exposed portion of the conductive interconnect layer in the bonding pad region; and
performing a third etching process to pattern a conductive layer to form a bonding pad, wherein conductive layer overlays the exposed portion of the conductive interconnect layer and the bonding pad is separated from a sidewall of the semiconductor substrate by a first distance.

12. The method of claim 11, wherein a first portion of the bonding pad overlays the oxide layer and a second portion of the bonding pad directly contacts the exposed portion of the conductive interconnect layer.

13. The method of claim 11, further comprising forming a conductive layer over a back side of the semiconductor substrate and in contact with the exposed portion of the conductive interconnect layer.

14. The method of claim 11, wherein the first distance is in a range from about 3 μm to about 4 μm.

15. The method of claim 11, wherein a portion of the bonding pad overlaps a portion of the ILD layer by a second distance, wherein the second distance is different than the first distance.

16. The method of claim 11, further comprising cutting through the scribe line region to separate a first image sensor device of the plurality of image sensors from a second image sensor device of the plurality of image sensors.

17. A method of fabricating an image sensor device, the method comprising:
bonding a carrier substrate to a first side of a device substrate;
thinning the device substrate from a second side of the device substrate, the second side being opposite the first side;
etching the second side of the thinned device substrate to remove a portion of the thinned device substrate to expose a portion of an interconnect structure positioned between the carrier substrate and the first side of the thinned device substrate;
etching an inter-layer dielectric (ILD) layer of the interconnect structure to expose a portion of a conductive line of the interconnect structure;
forming an oxide layer over the second side of the device substrate and over the exposed portion of the conductive line;
removing the portion of the oxide layer that is over the exposed portion of the conductive line; and
forming a bonding pad over the exposed portion of the conductive line of the interconnect structure, the bonding pad being separated from a sidewall of the thinned device substrate by a first distance.

18. The method of claim 17, wherein bonding the carrier substrate to the first side of the device substrate comprises forming a buffer layer over the interconnect structure and bonding the buffer layer to the carrier substrate, wherein the buffer layer includes a dielectric material.

19. The method of claim 17, wherein the thinned device substrate has a thickness that is greater than 1 μm.

* * * * *